(12) United States Patent
Varadarajan et al.

(10) Patent No.: US 12,259,789 B2
(45) Date of Patent: Mar. 25, 2025

(54) NON-VOLATILE MEMORY COMPRESSION FOR MEMORY REPAIR

(71) Applicant: TEXAS INSTRUMENTS INCORPORATED, Dallas, TX (US)

(72) Inventors: Devanathan Varadarajan, Allen, TX (US); Ramakrishnan Venkatasubramanian, Saratoga, CA (US); Varun Singh, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 27 days.

(21) Appl. No.: 18/239,880

(22) Filed: Aug. 30, 2023

(65) Prior Publication Data

US 2023/0409435 A1 Dec. 21, 2023

Related U.S. Application Data

(63) Continuation of application No. 17/901,337, filed on Sep. 1, 2022, now Pat. No. 11,748,202, which is a
(Continued)

(51) Int. Cl.
*G06F 11/14* (2006.01)
*H03M 7/30* (2006.01)

(52) U.S. Cl.
CPC ........ *G06F 11/1448* (2013.01); *H03M 7/30* (2013.01); *G06F 2201/82* (2013.01)

(58) Field of Classification Search
CPC ........ G06F 11/14; G06F 11/1448; H03M 7/30
See application file for complete search history.

(56) References Cited

U.S. PATENT DOCUMENTS 5,630,092 A * 5/1997 Carreiro ............... G06F 3/0601
708/203
7,350,119 B1 3/2008 Zuraski et al.
(Continued)

FOREIGN PATENT DOCUMENTS

WO 2017039801 A1 3/2017

OTHER PUBLICATIONS

V. Sridhar et al., "Built-in self-repair (BISR) technique widely Used to repair embedded random access memories (RAMs)" International Journal of Computer Science Engineering (IJCSE) vol. 1 No. Sep. 1, 2012; 19 pages.
(Continued)

*Primary Examiner* — Kamini B Patel
(74) *Attorney, Agent, or Firm* — Carl G. Peterson; Frank D. Cimino

(57) ABSTRACT

One example includes an integrated circuit (IC). The IC includes non-volatile memory and logic. The logic is configured to receive repair code associated with a memory instance and assign a compression parameter to the repair code based on a configuration of the memory instance. The logic is also configured to compress the repair code based on the compression parameter to produce compressed repair code and to provide compressed repair data that includes the compressed repair code and compression control data that identifies the compression parameter. A non-volatile memory controller is coupled between the non-volatile memory and the logic. The non-volatile memory controller is configured to transfer the compressed repair data to and/or from the non-volatile memory.

20 Claims, 6 Drawing Sheets

Related U.S. Application Data continuation of application No. 17/125,244, filed on Dec. 17, 2020, now Pat. No. 11,436,090.

(56) References Cited

U.S. PATENT DOCUMENTS

| | | | |
|---|---|---|---|
| 7,415,640 B1 * | 8/2008 | Zorian | G11C 29/4401 |
| | | | 365/201 |
| 7,751,264 B1 | 7/2010 | Wu et al. | |
| 8,134,880 B2 | 3/2012 | Anzou | |
| 8,719,648 B2 | 5/2014 | Gorman | |
| 9,053,799 B2 | 6/2015 | Varadarajan et al. | |
| 9,318,222 B2 | 4/2016 | Varadarajan et al. | |
| 9,852,810 B2 | 12/2017 | Varadarajan et al. | |
| 10,134,483 B2 | 11/2018 | Varadarajan et al. | |
| 10,600,495 B2 | 3/2020 | Varadarajan et al. | |
| 11,436,090 B2 | 9/2022 | Varadarajan et al. | |
| 2001/0047461 A1 * | 11/2001 | Milillo | G06F 11/1448 |
| | | | 714/E11.12 |
| 2003/0204783 A1 * | 10/2003 | Kuroda | G11C 29/44 |
| | | | 714/35 |
| 2004/0210608 A1 * | 10/2004 | Lee | G06F 11/1451 |
| 2008/0008015 A1 * | 1/2008 | Darbinyan | G11C 29/802 |
| | | | 365/200 |
| 2008/0065929 A1 * | 3/2008 | Nadeau-Dostie | G11C 29/802 |
| | | | 714/E11.054 |
| 2008/0104469 A1 * | 5/2008 | Riley | G11C 29/802 |
| | | | 714/E11.169 |
| 2011/0058434 A1 * | 3/2011 | Anzou | G11C 29/785 |
| | | | 365/201 |
| 2012/0207068 A1 | 8/2012 | Watson | |
| 2013/0021861 A1 * | 1/2013 | Shvydun | G11C 29/72 |
| | | | 365/200 |
| 2013/0031319 A1 * | 1/2013 | Gorman | G11C 29/785 |
| | | | 711/E12.079 |
| 2016/0172058 A1 * | 6/2016 | Srivastava | G11C 29/802 |
| | | | 714/6.31 |
| 2018/0374556 A1 | 12/2018 | Varadarajan et al. | |
| 2019/0156908 A1 | 5/2019 | Varadarajan et al. | |
| 2020/0321071 A1 | 10/2020 | Varadarajan et al. | |
| 2022/0197750 A1 * | 6/2022 | Varadarajan | H03M 7/30 |

OTHER PUBLICATIONS

International Search Report dated Mar. 24, 2022, International Patent Application No. PCT/US2021/063951, 7 pages.

* cited by examiner

NON-VOLATILE MEMORY COMPRESSION FOR MEMORY REPAIR

This application is a continuation of U.S. patent application Ser. No. 17/901,337, filed Sep. 1, 2022, currently pending and scheduled to grant as U.S. Pat. No. 11,748,202 on Sep. 5, 2023, which is a continuation of U.S. patent application Ser. No. 17/125,244, filed Dec. 17, 2020 (now U.S. Pat. No. 11,436,090), which is hereby incorporated by reference herein in its entirety.

TECHNICAL FIELD

This disclosure relates to non-volatile memory compression for memory repair.

BACKGROUND

Integrated circuits (ICs) generally include various modules combined to perform various functions. For example, a digital signal processor (DSP) includes processor and memory instances embedded in the IC. The memory instances containing plurality of addressable memory locations are tested for defects, ensuring the operability of the IC. To test these blocks, special test circuits, referred to as "Built-In Self-Test" (BIST) circuits are incorporated into the IC. BIST circuits generate a test pattern to determine whether the memory instance is defective or not.

Non-volatile memory, such as electronic fuse (eFuse) or FuseROM, is also used for memory repair. For example, FuseROM may store data representing a repair code (also referred to as a repair signature) that identifies a defective element in the memory instance. A repair signature for the memory instances under test may be stored in the FuseROM. The repair signature is used for repair of defective elements within the respective memory instances by identifying the location of the defective elements. In a system with many memories, the size of the FuseROM may be directly related to the sum of the total number of repairable memory instances in the IC. While memory repair is needed to improve yield of devices, existing implementations of FuseROM do not scale well as device densities continue to increase and device sizes decrease.

SUMMARY

In a described example, an integrated circuit (IC) includes non-volatile memory and logic. The logic is configured to receive repair code associated with a memory instance and assign a compression parameter to the repair code based on a configuration of the memory instance. The logic is also configured to compress the repair code based on the compression parameter to produce compressed repair code and to provide compressed repair data that includes the compressed repair code and compression control data that identifies the compression parameter. A non-volatile memory controller is coupled between the non-volatile memory and the logic. The non-volatile memory controller is configured to transfer the compressed repair data to and/or from the non-volatile memory.

In another described example, an integrated circuit (IC) includes a repairable memory system including a memory instance. A memory repair controller is coupled to the repairable memory system. The memory repair controller is configured to generate repair code associated with the memory instance. A control wrapper is coupled to the repairable memory system and the non-volatile memory. The control wrapper includes logic configured to receive compressed repair data that includes compressed repair code and compression control data from the non-volatile memory. The compressed repair code is a compressed version of the repair code associated with the memory instance. The logic is also configured to decompress the compressed repair code based on the compression control data to produce the repair code for the memory instance. A non-volatile memory controller is coupled between the non-volatile memory and the logic. The non-volatile memory controller configured to transfer the compressed repair data to and/or from the non-volatile memory.

In another described example, a method includes storing compressed repair data in non-volatile memory of an integrated circuit (IC). The compressed repair data includes compression control data and a compressed repair code for a respective memory instance of a repairable memory system implemented on the IC. The method also includes decompressing the compressed repair data into a repair code for the respective memory instance based on the compression control data. The method also includes transferring the repair code to the respective memory instance of the repairable memory system.

DETAILED DESCRIPTION

Figure 1:
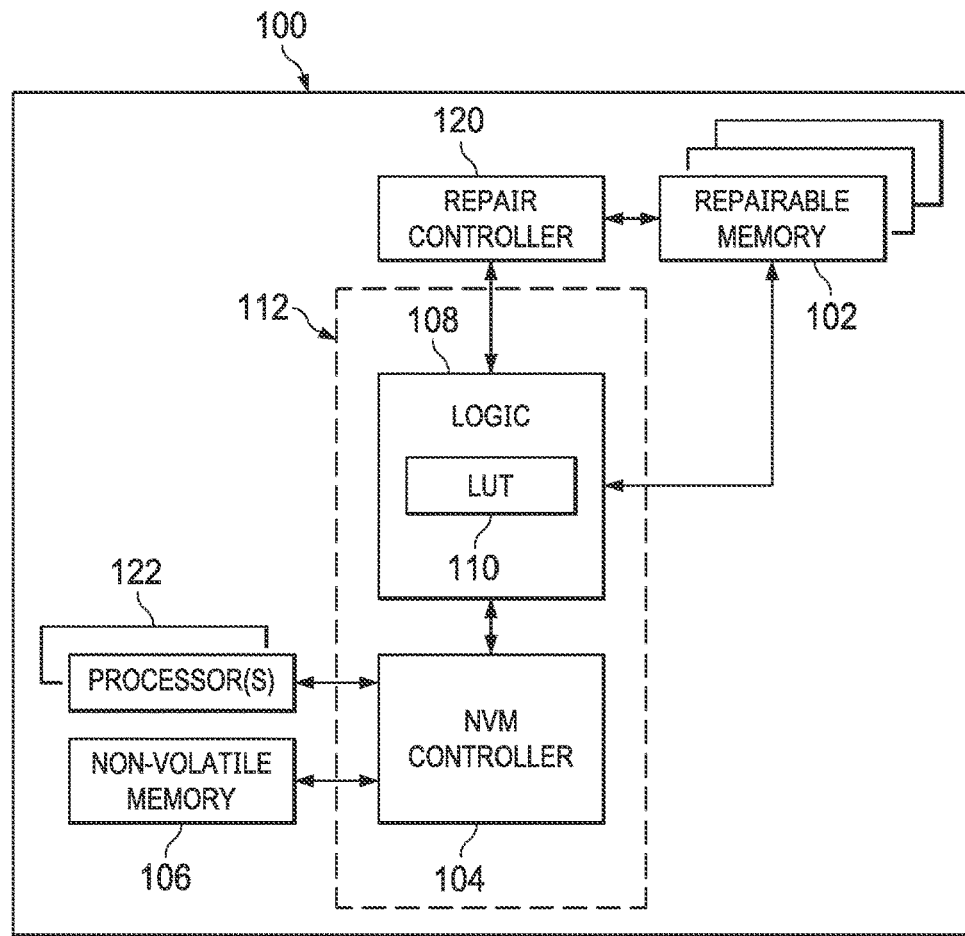
FIG. 1 is a block diagram of an example integrated circuit that includes a memory repair system implementing non-volatile memory compression.

Memory repair is used to improve yield of integrated circuits (ICs) devices by generating memory repair codes (e.g., repair signatures) for respective memories of a repairable memory system that are determined to have defective memory elements (e.g., rows and/or columns of memory cells). For example, the repair code may include a repair signature having a number of bits (e.g., a fixed number of bits for a memory device) to identify defective memory elements. One or more repair signatures for a memory may be stored in the non-volatile memory. A repairable memory is configured to have one or more spare memory elements (rows and/or columns) that are used to replace defective elements (rows and/or columns) of memory. The identity of the defective memory elements that need to be replaced for a given memory instance is identified by a respective memory repair code (a signature) for the given memory instance. The memory repair code repairs the defective elements within the memory by enabling the memory system to replace the defective elements (identified by the signature) with the corresponding spare memory elements. The length (number of bits) of usable repair signature depends upon the actual number of repairable elements (rows and/or columns) in the given memory instance. Different memory instance configurations may have different numbers of repairable elements (rows and/or columns). Therefore, different respective memory instances may have different number of usable bits in the repair codes for the respective memory instances. However, for a variety of reasons, including comply with a word size of the non-volatile memory and maintaining uniform repair code size across heterogeneous memories, the repair signature code for a given memory instance may include usable bits and additional padding bits. Further, not all memories on an IC may be defective needing a repair. Repair codes for those memories that are not repaired and repair signature bits beyond the usable range for a particular memory instance remain unused resulting in wasted area of the non-volatile memory allocated for repair. This description provides an area efficient compression technique for repair codes stored on non-volatile memory that may be implemented to store and/or retrieve repair codes for memory instances of a repairable memory system.

As an example, an IC includes non-volatile memory configured to store compressed repair data corresponding to defective memory instances of a repairable memory system. For example, the non-volatile memory may include one or more electrical FuseROM, one-time programmable ROM (OTP ROM), electrically programmable ROM (EPROM), or electrically erasable programmable ROM (EEPROM). The compressed repair data for a respective memory instance includes one or more bits of compression control data as well as bits representing a compressed (e.g., compacted) version of the memory repair code, which is referred to herein as a compressed repair code. The compressed version of the repair code may also be referred to herein as a compressed repair code.

A non-volatile memory controller is coupled to the non-volatile memory. In an example, the non-volatile memory controller is configured to read the compressed repair data for a respective memory instance from the non-volatile memory. The non-volatile memory controller includes logic configured to decompress the compressed repair data for the respective memory instance back into a full (uncompressed) repair code (e.g., a repair signature) based on the compression control data. In another example, the non-volatile memory controller is configured to receive uncompressed repair code (e.g., a repair signature) that has been generated for repair of a given memory instance. The non-volatile memory controller includes additional logic configured to compress the repair code into a compressed repair code. The logic also provides compressed repair data having a number of one or more bits of compression control data as well as bits representing the compressed repair code. The processes of storing and reading compressed repair data may be repeated for each of the memory instances of a repairable memory system implemented on the IC.

As a further example, memory repair may be performed at multiple conditions and process corners, and the repair data is incrementally written to the non-volatile memory (e.g., FuseROM) in each of those corners. The approach described herein thus employs area-efficient compression that can support lossless compression (e.g., no information is lost during compression). As described herein, the compression may store only usable repair signature bits based on actual number of repair signature bits per memory instance, which reduces coding overhead and is independent of repair density and the number of repairs. The approach further can support multi-pass and/or incremental memory repair, and further may work with any off-the-shelf (or proprietary) non-volatile (e.g., FuseROM) controller.

FIG. 1 depicts an IC 100 implementing an example memory repair system. The IC 100 includes a memory system 102 that includes repairable memory. For example, the memory system 102 is implemented as a control wrapper that includes one or more memory instances, registers configured to store repair data, and logic configured to link the repair data to the respective memory instances. A memory instance may be implemented on the IC 100 according to any form of storage. For example, memory system 102 may include one or more types of memory instances, such as SRAM, DRAM, DDR memory, SDRAM, or the like. In an example, memory instances implemented in the memory system 102 may be the same type of memory. In another example, memory instances are implemented as different types of memories (e.g., some blocks are SRAM memories and other blocks are DDR memories). Each memory instance may also include a repair register configured to store repair code that is determined (e.g., by a repair controller) for the respective memory instance. For example, the repair register of a given memory instances may be implemented as spare memory cells (e.g., one or more rows and/or columns) or a dedicated separate memory block.

The IC 100 includes a non-volatile memory (NVM) controller 104 coupled to non-volatile memory 106. The non-volatile memory 106 is configured to store compressed repair data for memory instances of the memory system 102. In an example, the compressed repair data includes compression control data and a compressed version of the repair code, each of which may include a number of bits. The compression control data has a value that is assigned to the repair code for respective memory instances of the memory system 102. As described herein, the compression control data is used to control decompression of compressed repair data stored in the non-volatile memory 106.

In the example of FIG. 1, the IC 100 includes logic 108. The logic 108 may be configured for compression, decompression or a combination of compression and decompression. The 108 may be coupled to the NVM controller 104, a repair controller 120 and to the memory system 102, as shown. In an alternative example, the 108 may be implemented as part of the NVM controller 104, which itself may be coupled to the memory system 102. The 108 may be implemented as hardware (e.g., circuitry, a processor, field programmable gate array (FPGA) or combinations thereof), as software (e.g., instructions executable by one or more processor cores) or as a combination of hardware and software.

In some examples, the NVM controller 104 and the logic 108 may be implemented within a wrapper 112. The wrapper 112 may include the logic 108 and other circuitry configured to perform the data transfer and storage functions described herein. By implementing the additional logic and associated circuitry at the wrapper 112 instead of within the NVM controller, the compression functions being implemented do not impact the IP cores of the memory repair system. The wrapper level configuration also does not impact memory repair software already implemented and facilitates extending the compression technique to existing (e.g., legacy) systems.

The 108 may include a state machine (see, e.g., FIG. 7) configured to control the transfer and conversion of data between the non-volatile memory and the memory system 102. For the example of compressing repair code (e.g., repair signature) for a respective memory instance, the state machine is configured to control transfer of repair code from the respective memory instance of memory system 102, compress the repair code and store corresponding compressed repair data in the non-volatile memory 106. For the example of repair code decompression, the state machine is configured to control the 108 to retrieve compressed repair data from the non-volatile memory 106, decompress the compressed repair data and transfer the uncompressed repair code to the respective memory instance of memory system 102.

In some examples, the state machine of the 108 includes a look-up table 110 to further control compression and decompression of repair codes. For example, the look-up table 110 may include one or more compression functions indexed by compression control data that has been assigned to respective repair code that has been retrieved from the memory system 102. Each compression function may control compression (e.g., compaction technique or algorithm) used to compress the repair code to a compressed version thereof (e.g., having a fewer number of bits) based on a compression parameter. For example, the logic 108 is configured to assign a compression parameter to the repair code based on a configuration of the memory instance. The compression parameter may indicate a number of bits (e.g., least significant bits) that may be removed from a given repair code without losing usable repair signature bits of the given repair code. The compression parameter thus may be assigned depending on a configuration of the memory instance. As described, a repair code may be generated for each memory instance with a number of bits that is set according to the configuration of the memory instance. By knowing the configuration of each memory instance, the compression parameter may be assigned based on an identifier for each memory instance for which the repair code is generated. The memory identifier may be provided with the repair code or be indicated by a value of memory register that specifies the respective memory instance.

In an example, the 108 is configured to remove a number of bits from the repair code based on the compression parameter to provide a compressed version of the repair code (compressed repair code). The 108 is also configured to add the compression control data to the compressed repair code. The 108 further is configured to provide the compressed repair data to the NVM controller 104. The NVM controller 104 transfers the compressed repair data into the non-volatile memory 106. In an alternative example, the 108 is coupled to the non-volatile memory 106 and thus is configured to transfer the compressed repair data directly to the non-volatile memory 106 (without going through the NVM controller 104). After the compressed repair data is stored in the non-volatile memory 106, the stored compressed repair data remains available at power-up and system reset.

In another example, the 108 also employs the look-up table 110 to decompress compressed repair data that is retrieved from the non-volatile memory 106 for a respective memory instance. For example, at start up (e.g., a power on reset condition of the IC 100), the NVM controller 104 is activated to retrieve compressed repair data from the non-volatile memory 106 and provide the compressed repair data to the 108. The 108 employs the look-up table 110 to control decompression of the compressed repair data based on the compression control data thereof. In an example, the 108 extracts the compression control data from the compressed repair data and applies the compression control data as an index to the look-up table 110. The look-up table 110 returns a result that identifies a number of bits that are to be added to the compressed repair code to restore it to the original repair code. The 108 is further configured to transfer the repair code to a repair register of the memory system 102 for use in repairing a respective memory instance in the memory system 102. The process may be repeated for each of the memory instances of the memory system 102 based on the compressed data stored in the non-volatile memory 106 for the remaining memory instances.

As a further example, the 108 may assign repair codes to respective bins based on an actual number of usable repair signature bits in the original (uncompressed) repair codes for respective memory instances. The number of actual usable repair signature bits in each repair code is known for each memory instance of the memory system 102. As described, different types and configurations of memory instances may have different numbers of usable repair signature bits. To enable testing and repair, each memory instance stores a repair code in a repair register having a number of bits that is equal to or greater than the actual usable repair bits. Accordingly, 108 can assign repair code for each memory instance of memory system 102 to a respective bin based on identifying for which memory instance each repair code has been generated. That is, repair code may be assigned to a respective bin based on an identity of the respective memory instance being repaired. Each bin may include a respective compression parameter that is used by the logic 108 to control compression (e.g., compaction) of the repair code.

As a further example, given a known number of usable repair signature bits in repair code for repairing respective memory instances, each bin may represent a different number of usable repair signature bits. The number of usable repair signature bits in repair code for a respective memory instance may be less than the total number of available repair signature bits in the repair code. Thus, the 108 is configured to assign the original repair code for a given memory instance to a respective bin based on the actual repair bit usage (e.g., the number of usable repair signature bits). Each bin is further assigned a unique value of compression control data that identifiers the compression parameter for the respective bin. The look-up table 110 is thus configured to map different values of the compression control data to the respective bins. The compression control data is added to the compressed repair code to provide the compressed repair data that is ultimately stored in the non-volatile memory 106 as a compressed version of the original repair code. In an example, the value of the compression control data that is mapped to the respective bins may be set based on a frequency at which repair codes are assigned to the respective bins, a size of repair codes in the respective bins and/or values of the repair code in the respective bins.

Additionally, in some examples, the compression control data may be configurable (e.g., by the logic 108), such as having a unique value depending on which bin the repair code has been assigned. In an example, the compression control data for each bin is configurable based on the number of bits (or ranges of bits) of usable repair code that is assigned to the respective bins. For example, a smaller value of compression control data may be assigned to a repair code having a larger bit length usable for repair, and a larger compression control data value can be assigned to a repair code having a smaller bit length usable for repair. In an additional, or alternative example, the bin to which a greater number of repair codes are assigned (e.g., the highest frequency bin with the largest number of instances of repair codes) may be assigned a lowest compression control data value. In contrast, the bin to which the fewest repair code instances are assigned (e.g., the lowest frequency bin) may be assigned a higher (or highest) compression control data value. By assigning compression control data values in one or a combination of these approaches can help reduce the amount of data stored in the non-volatile memory 106. As a result, the non-volatile memory 106 may be formed with a reduced area on the IC 100 compared to existing approaches.

By way of further example, assume there are four bins (e.g., bin #0, bin #1, bin #2 and bin #3), each having a respective compression parameter. Thus, memory instances with a set of repairable units of memory that can be addressed using 4 bits or less (i.e., less than or equal to 4 bits of usable repair signature code) may be assigned bin #0. Memory instances with a set of repairable units of memory that can be addressed using between 4 bits and 8 bits (i.e., more than 4 and less than or equal to 8 bits of usable repair signature code) may be assigned bin #1. Memory instances with a set of repairable units of memory that can be addressed using between 8 bits and 16 (i.e., more than 8 and less than or equal to 16 bit usable repair signature code) may be assigned bin #2, and other memory instances with different bits of usable repair signature code may be assigned bin #3. In some examples, the repair code may be assigned to respective bins based on the respective memory instance for which the repair code has been generated and/or configuration of the respective memory instance. In an example, the logic 108 may be configured to remove a number of bits from each repair code based on the compression parameter associated with the respective bin. For example, the logic 108 may use the compression parameter to compact the bits of a repair code to a reduced number of bits equal to the maximum number of bits that may be assigned to the respective bin.

As described above, the look-up table 110 is configured to map each repair code bin to compression control data that is assigned to and identifies the respective bin. The logic 108 may append the assigned compression control data to the compressed repair codes to enable subsequent decompression (by logic 108). For example, the compression control data may be implemented a prefix, a postfix or a set of bits distributed at known locations in the compressed repair data. In an example, the number of bits used for compression control data for the respective bins may vary up to a maximum number of bits. The values used for compression control data bits may also be set to enable logic 108 to extract the compression control data bits from the compressed repair data. As an example, the 108 is configured to extract up to a set number (e.g., three) most significant bits or until encountering a '0', which is designated as a last bit of the compression control data.

Continuing with the above example with four bins and where the compression control data is implemented as a prefix, repair data assigned to bin #1 may be assigned a prefix (compression control data) of '0'. Similarly, repair data assigned to bin #2 may be assigned prefix code of '10', repair data assigned to bin #3 may be assigned prefix code of '110' and repair data assigned to bin #0 may be assigned a prefix code of '111'. In other examples, different numbers of bins may be used and different values of compression control data may be assigned to such bins.

In some examples, the IC 100 includes other circuitry, including a repair controller 120 and one or more processors 122, collectively designed for any desired function. The memory system 102 may include caches implemented in a microprocessor or other arrays implemented in the microprocessor (e.g. translation lookaside buffers etc.). In an alternative example, the IC 100 includes one or more processors and supporting circuitry (e.g. the NVM controller 104 and repair controller 120) in an integrated processor configuration (e.g. a microcontroller or embedded processor). In such an implementation, the memory system 102 includes caches or other memories for the processor as well as memories for the supporting circuitry. In another example, one or more processors and one or more peripheral circuits (e.g. I/O interface circuits or integrated I/O peripherals) are included in a system on chip (SoC) configuration. The memory system 102 would then include caches or other memories for the processor as well as memories for the peripheral circuits. In other examples, the IC 100 includes no processors and is a fixed-function integrated circuit, such as an application specific integrated circuit (ASIC) or field programmable gate array (FPGA).

As a further example, the repair controller 120 is coupled to one or more memory wrappers of the memory system 102. Each memory wrapper may include circuitry to enable communication and data transfer between the repair controller and the respective memory instances for testing and repair thereof in the memory system 102. For example, responsive to testing one or more memory instances, the repair controller 120 is configured to generate a repair code to identify defective memory elements (e.g., rows and/or columns) for memory instances of the memory system 102. The repair controller 120 may store the repair code in a repair register of the respective memory instances within memory system 102. In the described example where the non-volatile memory 106 is a FuseROM, the repair registers of the memory system 102 may be implemented as fuse registers into which the repair controller stores repair codes for respective memory instances.

As a further example, the repair controller 120 is configured to perform self-repair of the memory system 102. For example, on activation (e.g., power up) of the IC 100, the repair controller 120 performs self-repair of the memory instances in memory 102. The repair controller 120 generates respective repair codes for each memory instance based on the results of a memory test. After generating the repair code for a given memory instance, the repair controller 120 activates the NVM controller 104 to store the repair code for the respective memory instance in the non-volatile memory 106. For example, the 108 is configured to compress the repair code and transfer corresponding compressed repair data to the non-volatile memory 106, as described herein.

Figure 2:
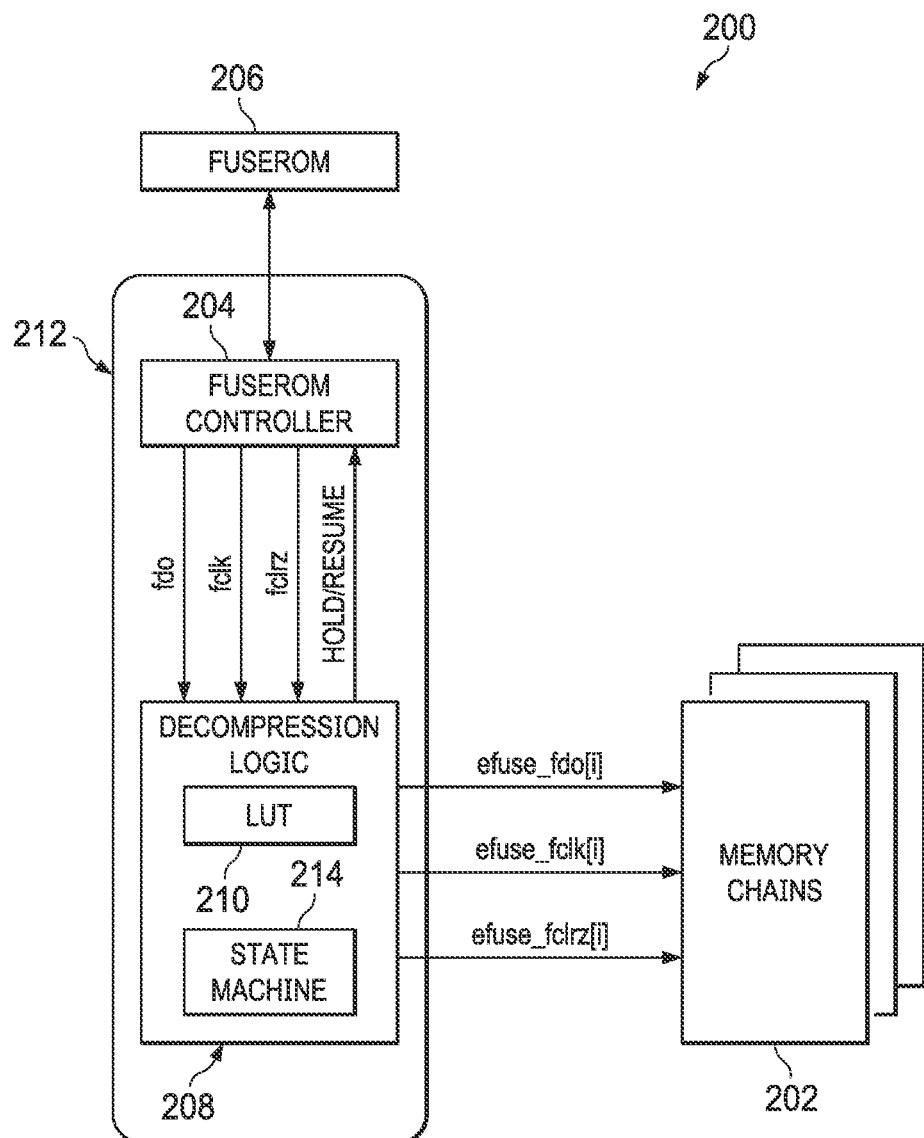
FIG. 2 is a block diagram of part of a memory repair system illustrating an example control wrapper configured to decompress compressed repair data.

FIG. 2 depicts an example of a system 200 showing a data flow for decompression of repair codes, which are stored in non-volatile memory implemented as a FuseROM 206, to respective memory chains 202 of a memory system (e.g., memory system 102). The repair registers (e.g., spare rows and/or columns) of respective memory instances of the memory system may be connected in a daisy chain configuration, and thus are referred to as memory chains 202. The system 200 of FIG. 2 includes examples of various parts and features described with respect to FIG. 1, and such features are shown in FIG. 2 by the same reference number increased by adding 100.

In the example of FIG. 2, the compressed repair data is stored in the FuseROM 206 that is coupled to a FuseROM controller 204. The FuseROM controller 204 is coupled to decompression logic 208. The decompression logic 208 includes a state machine (e.g., a finite state machine) 214 and a look-up table 210. As described herein, the decompression logic 208 is configured to decompress the compressed repair data that is stored in the FuseROM 206. In an example, the FuseROM controller 204 and the decompression logic 208 may be implemented in a control wrapper 212 that includes logic and other circuitry to manage transfer of data between the FuseROM 206 and the memory chains 202.

As an example, the FuseROM controller 204 is activated (e.g., in response to an activation signal from a repair controller (e.g., repair controller 120) to read compressed repair data from the FuseROM 206. The FuseROM controller 204 provides the compressed repair data to the decompression logic 208 through a data line, shown as fdo to indicate a fuse data out signal. The FuseROM controller 204 also provides a fuse clock signal and a fuse reset signal through respective signal lines, shown as fclk and fclrz. The fuse clock signal is used to shift the data over the data out line fdo. The fuse reset signal (fclrz) is asserted to indicate that shifting of the repair code has been completed.

The decompression logic 208 uses the state machine 214 and look-up table 210 to control decompression of the compressed repair data into the original repair code, as described herein. The decompression logic 208 further is configured to transfer the repair code to memory chains 202 of the memory system. For example, the decompression logic 208 shifts the bits of the decompressed repair code into the memory chains 202 and into a corresponding repair register of the respective memory instance for which the repair code was generated. As a further example, the decompression logic 208 shifts the repair code through an efuse_fdo[i] line based on a clock signal shown as efuse_fclk[i], where i specifies which memory chain or fuse register the repair code is being loaded into. Prior to initiating the data transfer for a respective memory instance, the decompression block may optionally issue a reset signal, shown as efuse_clrz[i] to clear and/or reset the previously stored repair data.

Figure 3:
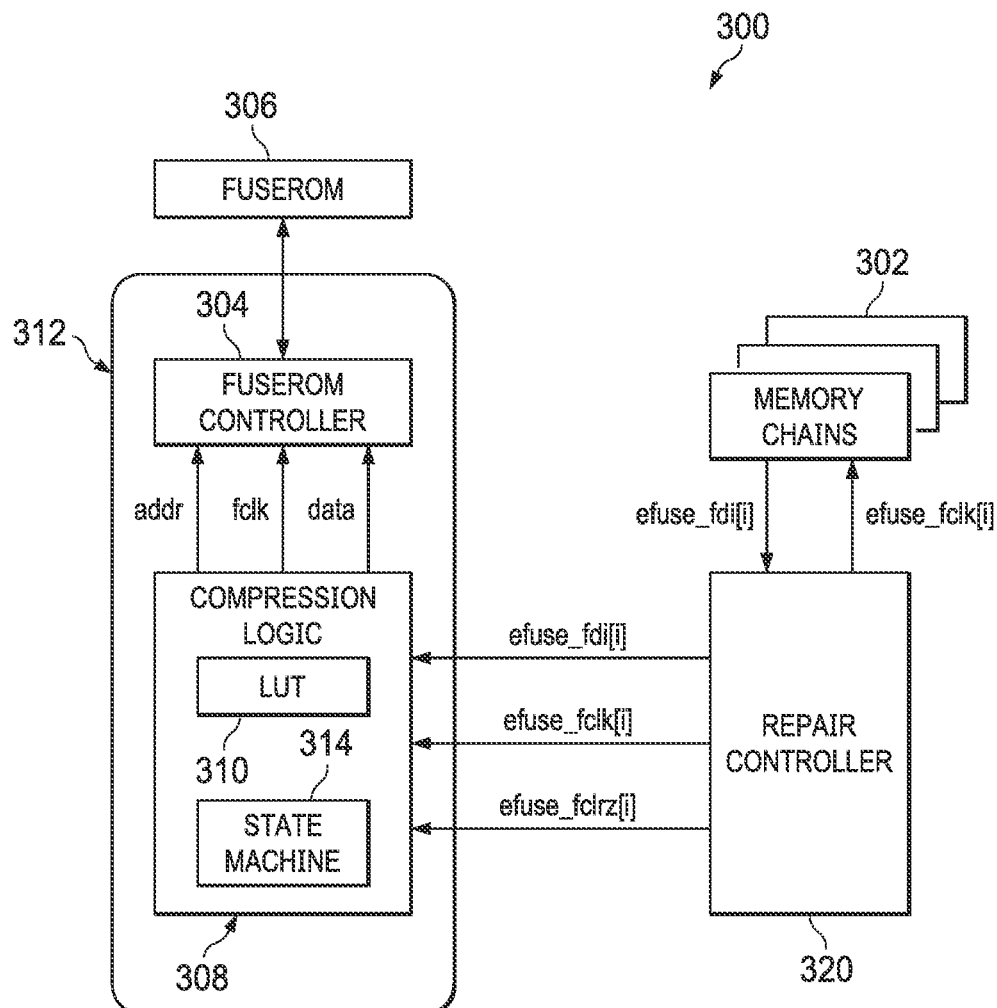
FIG. 3 is a block diagram of part of a memory repair system illustrating an example control wrapper configured to compress and store repair data.

FIG. 3 depicts an example of a system 300 showing a data flow for compression of repair code that has been stored in registers of memory chains 302 of memory, such as in response to a memory repair process implemented by repair controller 320. The system 300 of FIG. 3 includes examples of various parts and features described with respect to FIG. 1, and such features are identified in FIG. 3 by the same reference numbers increased by adding 200. For example, the repair controller 320 may be implemented as the repair controller 120 of FIG. 1.

In the example of FIG. 3, the repair codes are stored in repair registers of the memory chains 302 for respective memory instances, and are retrieved by the repair controller 320 through fuse data input, shown as efuse_fdi[i], and provided to the compression logic 308. The compression logic 308 is coupled to memory chains 302 through data lines, shown as efuse_fdi[i], and control lines, shown as efuse_fclk[i] and efuse_fclrz[i], where i designates an index for the memory instance. The efuse_fclk[i] line is used to supply a clock signal for shifting bits of repair data on line efuse_fdi[i] from the memory chains 302 through repair controller 320 and into the compression logic 308. The line efuse_fclrz[i] is used to signal that the data transfer for a respective memory instance has completed. The compression logic 308 includes a state machine 314 and a look up table 310. The compression logic 308 is also coupled to a FuseROM controller 304. In an example, the FuseROM controller 204 and the compression logic 208 may be implemented in a control wrapper 312 that includes logic and other circuitry to manage transfer of data between the repair controller 320 and the FuseROM 306.

As described herein, the compression logic 308 is configured to compressed repair codes that have been generated for respective memory instances into compressed repair data. The compression logic 308 transfers the compressed repair data to the FuseROM controller 304 for storage in the FuseROM 306. In some examples, the compression logic 308 is configured to compress (e.g., in software and/or hardware) repair codes received from the memory instances and add compression control data to the compressed repair codes, such as described herein. The compression logic 308 may then shift bits of the compressed repair data serially through the FuseROM controller 304 for storage in the FuseROM 306.

Figure 4:
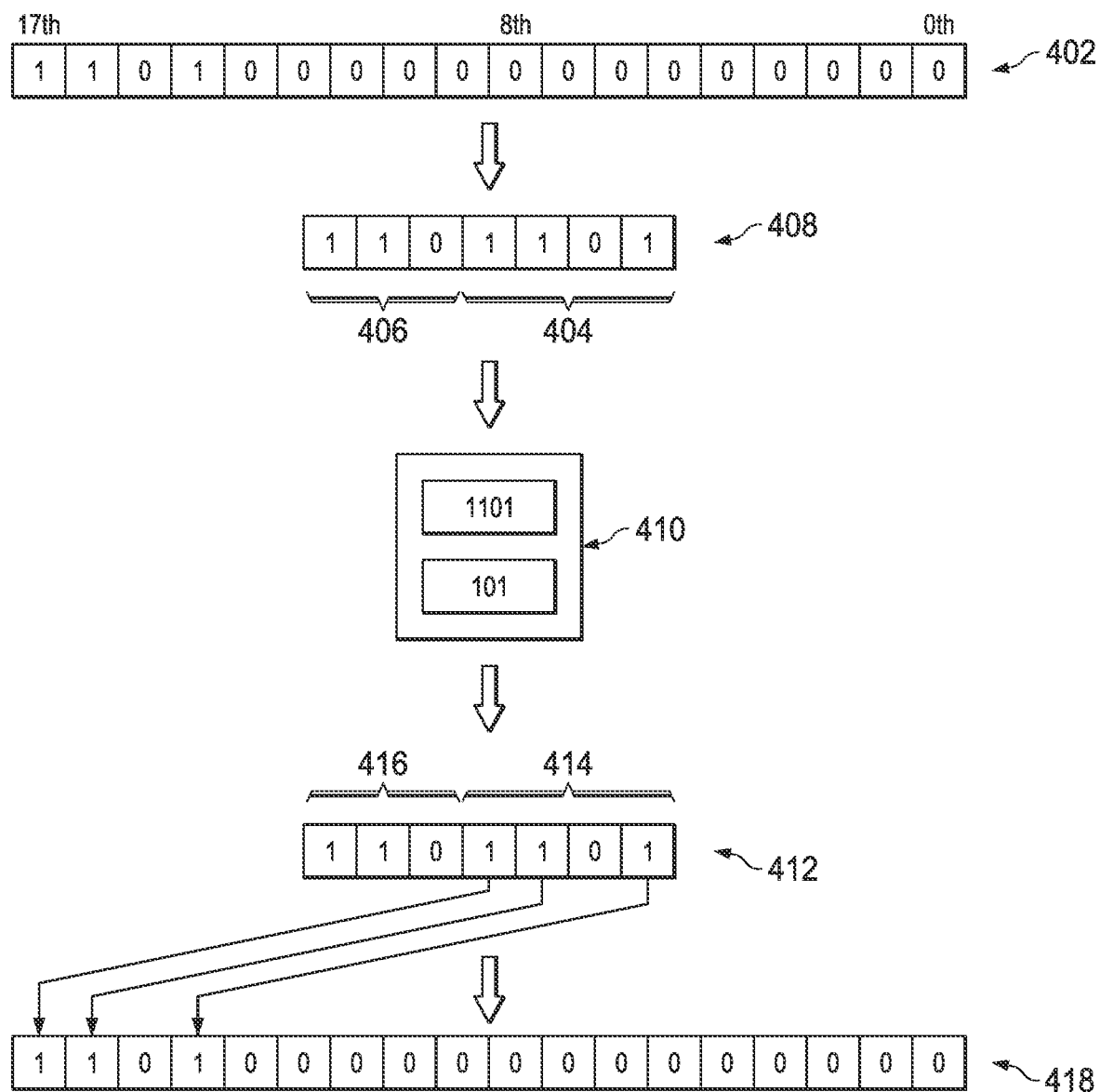
FIG. 4 depicts an example of repair data being compressed, stored and decompressed.
Figure 5:
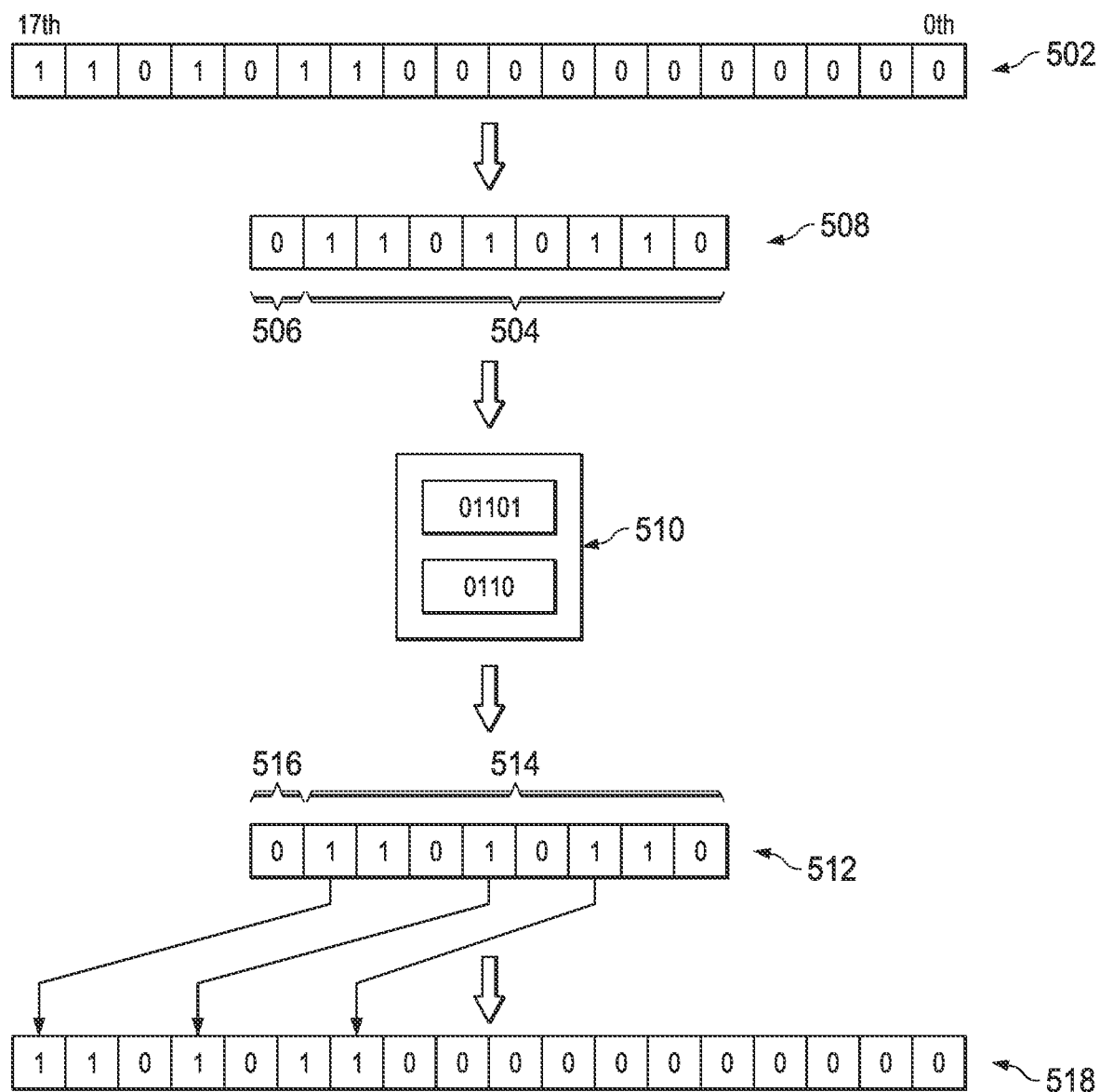
FIG. 5 depicts another example of repair data being compressed, stored and decompressed.
Figure 6:
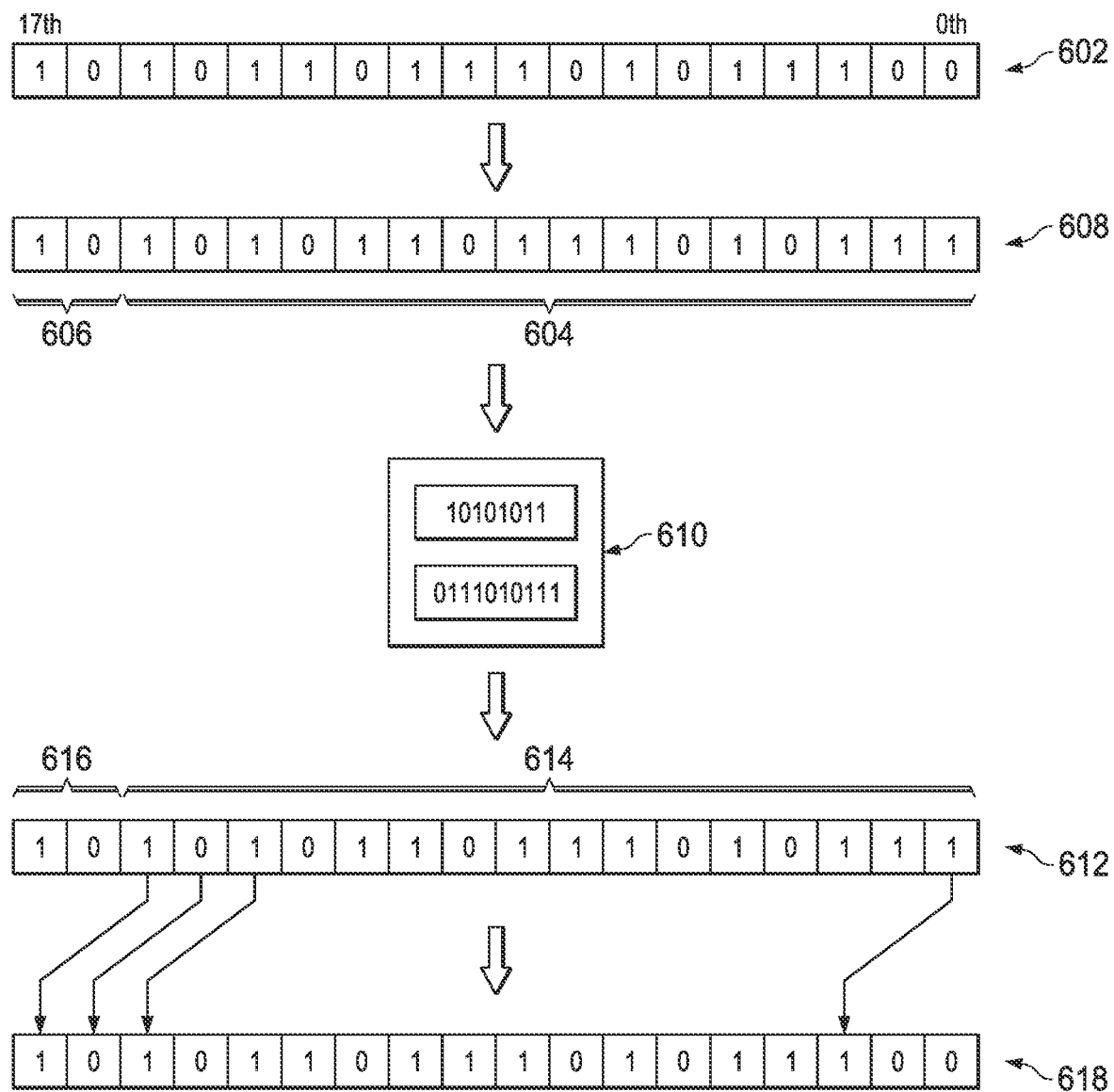
FIG. 6 depicts yet another example of repair data being compressed, stored and decompressed.

FIGS. 4, 5 and 6 depict example data processing flows for compression and decompression of different repair codes that may be implemented by memory repair systems (e.g., wrapper 112, 212, 312) described herein. In the examples of FIGS. 4, 5, and 6, the length of each repair code is shown as 18 bits; though other numbers of bits may be used in other examples. Additionally, the examples of FIGS. 4, 5 and 6 are described in the context of the four bins #0, #1, #2 and #3 described above. The data processing flow shown in FIGS. 4, 5 and 6 may be implemented by any of the systems of FIGS. 1, 2 and 3. Accordingly, the description of FIGS. 4, 5 and 6 also refers to FIGS. 1, 2 and 3.

In the example of FIG. 4, a multibit repair code ('110100000000000000') 402 for a given memory instance, with four usable repair signature bits and fourteen padding bits (based on the given memory instance configuration), is retrieved from a repair register of the given memory instance (e.g., memory 102, 202, 302). The repair code 402 may be assigned (e.g., by logic 108, 308) to a respective bin based on the size or value of the usable bits of the repair code 402. For example, the logic 108, 308 may assign repair code 402 to bin #0, which has been established for repair codes having less than or equal to four repair signature bits that are usable for repair. Compression logic (e.g., logic 108, 308) c the repair code 402 into a compressed repair code ('1101') 404 having a number of usable repair signature bits (i.e., four bits) according to its assigned bin. For example, repair codes assigned to bin #0 have a compression control data of '110'. Logic 108, 308 adds compression control data ('110') 406 to the compressed repair code 404 to provide compressed repair data 408. The compressed repair data 408 is transferred and stored in non-volatile memory (e.g., non-volatile memory 106, 206, 306), shown at 410. For example, the compressed repair data 408 is stored in a FuseROM by blowing a set of fuses based on the compressed repair data 408.

Responsive to being activated, such as at power-up or system reset, logic (e.g., logic 108, 208) is configured to retrieve compressed repair data 412 from the non-volatile memory 410. The compressed repair data 412 is the same as at 408 in that it includes compressed repair code ('1101') 414 and compression control data ('110') 416. The compression control data 416 is removed and compressed repair code ('1101') 414 is decompressed into the original repair code ('110100000000000000') 418. For example, logic 108, 208 adds fourteen trailing 0's to the four-bit compressed repair code 414 based on the compression control data ('0') 416 to provide a total of 18 bits for the repair code.

In the example of FIG. 5, a multibit repair code ('110101100000000000') 502 for a given memory instance is retrieved from a memory chain of memory (e.g., memory 102, 202, 302). In the example of FIG. 5, the repair code has eight usable repair signature bits based on the configuration of the respective memory instance. The logic 108, 308 may assign the repair code to a respective bin based on the size or value of the repair code, which may be known for the respective memory instance. For example, the repair code is assigned to bin #1, which has been established for repair codes having more than four and less than or equal to eight usable repair signature bits. Logic 108, 308 compacts the repair code 502 by removing ten least significant bits from the repair code to provide a compressed repair code ('11010110') 504 having a number of bits (e.g., 8 bits) according to its assigned bin. In an example, the first seven most significant bits of the compressed repair code ('1101011') 504 may be usable repair signature bits for the respective memory instance. Logic 108, 308 adds compression control data ('0') 506 to the compressed repair code 504 to provide corresponding compressed repair data 508. The logic 108, 308 transfers and stores the compressed repair data 508 in non-volatile memory (e.g., non-volatile memory 106, 206, 306), shown at 510.

For correcting defective memory instances, as described herein, logic 108, 208 retrieves the compressed repair data 512 from the non-volatile memory 510. The logic 108, 208 removes the compression control data ('0') 516 from the compressed repair data 508 and decompresses the remaining compressed repair code ('11010110') 514 into the original repair code ('110101100000000000') 518, such as by adding ten trailing 0's to the eight-bit compress code based on the compression control data ('0').

In the example of FIG. 6, logic 108, 308 retrieves a multibit repair code ('1010110111101011100') 602 from a memory chain of a memory system, (e.g., memory 102, 202, 302) that has been generated for another respective memory instance. In the example of FIG. 6, the repair code 602 has sixteen usable bits of repair signature code ('1010110111010111'). Logic 108, 308 thus assigns the repair code 602 to bin #2, which has been established for repair codes having more than eight and less than or equal to sixteen bits of usable repair signature bits. The logic 108, 308 compacts the repair code 602 to provide a compressed repair code ('1010110111010111') 604 having a number of bits (e.g., 16 bits) according to its assigned bin. Logic 108, 308 also adds compression control data ('0') 606 to the compressed repair code 604 to provide compressed repair data 608 ('10101011101110101111'). The compressed repair data 608 is stored in non-volatile memory (e.g., non-volatile memory 106, 206, 306), shown at 610.

For correcting the respective memory instance, such as at power-up or a system rest, the process is effectively reversed. The logic 108, 208 retrieves compressed repair data 612 from the non-volatile memory 610. The logic 108, 208 removes the compression control data ('0') 616 and decompresses the remaining compressed repair code ('1010110111010111') 614 into the original repair code ('1010110111101011100') 618, such as by adding two trailing 0's to the sixteen-bit compress code according to the compression control data.

Figure 7:
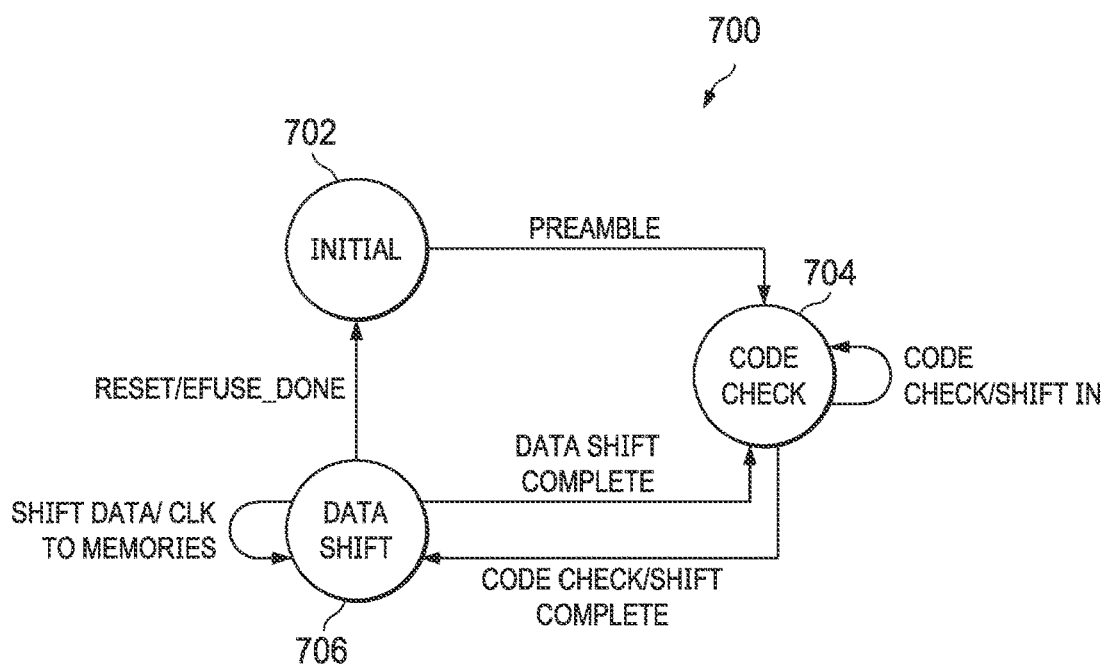
FIG. 7 depicts an example state machine that may be utilized for controlling decompression of repair data.

FIG. 7 is a state diagram 700 demonstrating operation of an example state machine implemented logic for performing decompression. For example, the state diagram 700 may be used to implement the state machine 214 of decompression logic 208. Accordingly, the description of the state diagram 700 also refers to FIG. 2.

The state diagram 700 includes an initial state 702, in which the logic 208, 212 waits for the start of data transfer. For example, the state machine 214 remains in the initial state until a preamble command data is received to initiate data transfer of repair data for a respective memory chain. The FuseROM controller 204 may use the preamble as a flag to determine the correctness and valid length of data that is shifted out for each chain. As an example, before a start of each chain of data, the FuseROM controller 204 shifts out a preamble to signify that valid data will be started after the preamble. This preamble returns to the controller after the end of chain shifting, signifying that the chain has loaded correctly.

The state machine 214 transitions from the initial state 702 to a code check state 704 responsive to receiving the preamble string of data (e.g., a bit signature). In state 704, the logic 208, 212 is configured to perform a code check and shifts in valid data from FuseROM (or other non-volatile memory) 206. For example, the logic 208, 212 employs a look-up table 210 to check the code that is being shifted out of the non-volatile memory 206 and to shift the compressed data into a shift register of the wrapper 212. As described herein, the logic 208, 212 employs the look-up table 210 to identify and remove compression control data from the compressed repair data and to restore the remaining compressed repair codes to the original version of respective repair codes that had been generated for the respective memory instance.

After the shifting in of compressed repair data to the logic has been completed and the compressed repair data has been restored to the repair code, as described herein, the state machine 214 transitions to a data shift state 706. In the data shift state 706, the logic 208, 212 shifts the data and clock signal to the memory chains 202. The process of shifting data out to the memory chains may be used for incremental repair of some memory instances or it may be performed for all memory instances. While data is being shifted out to the memory chains during operating in state 706, the decompression logic 208 may hold a clock of the FuseROM controller to pause operation of the FuseROM controller. After the retrieved repair data has been completely shifted out to the respective memory chains, the state machine 214 returns to the initial state 702. For example, the transition from 706 to 702 may include the logic 208, 212 generating a reset signal to indicate that the repair code has been read from the FuseROM.

In an example, compression logic 308 may implement a state machine (e.g., state machine 314) that is implemented as the inverse of the state diagram 700 for controlling decompression functions. In another example, a compression state machine may be omitted, and instead cumulative compressed data is loaded from the compression logic into the FuseROM through the FuseROM controller, as described herein.

In view of the foregoing examples, systems and methods are described to implement non-volatile memory compression for memory repair. The approach allows a lossless compression and decompression of repair codes while reducing the number of bits needed to be stored in non-volatile memory. Additionally, the systems described herein enable area efficient solutions by allowing storage space requirements in the non-volatile memory to be reduced through the compression techniques disclosed herein. Additionally, in examples where the logic to perform compression and decompression is implemented at a wrapper instead of within the NVM controller, the approach is backwards-compatible with existing/legacy systems. Moreover, the approach has little or no impact on external testing systems and repair software.

In this application, the term "couple" or "couples" means either an indirect or direct connection. Thus, if a first device is coupled to a second device, that connection may be through a direct connection or through an indirect connection via other devices and connections. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

The recitation "based on" means "based at least in part on." Therefore, if X is based on Y, X may be a function of Y and any number of other factors.

Modifications are possible in the described embodiments, and other embodiments are possible, within the scope of the claims.

The invention claimed is:

1. A system comprising:
   a controller; and
   a logic circuit configured to:
      receive preamble command data and compression control data from the controller;
      identify compression control data in compressed repair data in response to receiving the preamble command data;
      determine a number of padding bits based on the identified compression control data; and
      restore an original repair code based on the number of padding bits and further based on the compressed repair data.

2. The system of claim 1,
   wherein the logic circuit is further configured to remove the identified compression control data from the compressed repair data after identifying the compression control data, and
   wherein to restore the original repair code, the logic circuit is configured to add the number of padding bits to a remaining portion of the compressed repair data after removing the identified compression control data.

3. The system of claim 1, further comprising memory chains,
   wherein the logic circuit is further configured to shift the original repair code to the memory chains.

4. The system of claim 3, wherein the logic circuit is further configured to shift a clock signal to the memory chains after restoring the original repair code.

5. The system of claim 3, wherein the logic circuit is further configured to hold a clock of the controller to pause operation of the controller while shifting the original repair code to the memory chains.

6. The system of claim 1, wherein the logic circuit is further configured to perform a code check on the compression repair data in response to receiving the preamble command data by at least identifying the compression control data.

7. The system of claim 1, wherein the logic circuit is further configured to determine correctness of the compressed repair data based on the preamble command data.

8. The system of claim 7, wherein to determine the correctness of the compressed repair data, the logic circuit is configured to use the preamble command data as a flag.

9. The system of claim 1, wherein the logic circuit is further configured to determine a valid length of the compressed repair data based on the preamble command data.

10. The system of claim 9, wherein to determine the valid length of the compressed repair data, the logic circuit is configured to use the preamble command data as a flag.

11. A method comprising:
    receiving, by decompression logic, preamble command data;
    identifying, by the decompression logic, compression control data in compressed repair data in response to receiving the preamble command data;
    determining, by the decompression logic, a number of padding bits based on the identified compression control data; and
    restoring, by the decompression logic, an original repair code based on the number of padding bits and further based on the compressed repair data.

12. The method of claim 11, further comprising removing the identified compression control data from the compressed repair data after identifying the compression control data,
    wherein restoring the original repair code comprises adding the number of padding bits to a remaining portion of the compressed repair data after removing the identified compression control data.

13. The method of claim 11, further comprising shifting the original repair code to memory chains.

14. The method of claim 13, further comprising shifting a clock signal to the memory chains after restoring the original repair code.

15. The method of claim 13, further comprising holding a clock of a controller to pause operation of the controller while shifting the original repair code to the memory chains.

16. The method of claim 11, further comprising performing a code check on the compression repair data in response to receiving the preamble command data by at least identifying the compression control data.

17. The method of claim 11, further comprising determining correctness of the compressed repair data based on the preamble command data.

18. The method of claim 17, wherein determining the correctness of the compressed repair data comprises using the preamble command data as a flag.

19. The method of claim 11, further comprising determining a valid length of the compressed repair data based on the preamble command data.

20. The method of claim 19, wherein determining the valid length of the compressed repair data comprises using the preamble command data as a flag.

* * * * *